United States Patent
Moon et al.

(10) Patent No.: US 11,393,894 B2
(45) Date of Patent: Jul. 19, 2022

(54) DISPLAY APPARATUS

(71) Applicant: Samsung Display Co., Ltd., Yongin-si (KR)

(72) Inventors: Sangho Moon, Yongin-si (KR); Chungi You, Yongin-si (KR); Taekon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 16/906,502

(22) Filed: Jun. 19, 2020

(65) Prior Publication Data

US 2020/0403056 A1 Dec. 24, 2020

(30) Foreign Application Priority Data

Jun. 21, 2019 (KR) .................. 10-2019-0074122

(51) Int. Cl.
*H01L 27/32* (2006.01)
(52) U.S. Cl.
CPC ................................ *H01L 27/3276* (2013.01)
(58) Field of Classification Search
CPC ............. H01L 27/3276; H01L 27/3244; H01L 51/0023; H01L 51/52
See application file for complete search history.

(56) References Cited

U.S. PATENT DOCUMENTS

| | | | |
|---|---|---|---|
| 6,229,182 B1 | 5/2001 | Van Lieverloo | |
| 8,525,945 B2 | 9/2013 | Kim et al. | |
| 9,287,329 B1 * | 3/2016 | Lee | H01L 27/124 |
| 10,186,215 B2 | 1/2019 | Seo et al. | |
| 2011/0169813 A1 | 7/2011 | Jin et al. | |
| 2017/0125730 A1 * | 5/2017 | Song | H01L 51/5253 |
| 2018/0183003 A1 * | 6/2018 | Han | H01L 51/5228 |
| 2020/0286977 A1 * | 9/2020 | Roh | G09G 3/20 |
| 2021/0028261 A1 * | 1/2021 | Lee | H01L 27/3276 |
| 2021/0183961 A1 * | 6/2021 | Kim | H01L 27/3218 |
| 2021/0202452 A1 * | 7/2021 | Kim | H01L 25/167 |
| 2021/0257525 A1 * | 8/2021 | Ryu | H01L 27/156 |

FOREIGN PATENT DOCUMENTS

| | | |
|---|---|---|
| JP | 2002-518831 A | 6/2002 |
| KR | 10-0806802 B1 | 2/2008 |
| KR | 10-2011-0081442 A | 7/2011 |
| KR | 10-1579853 B1 | 12/2015 |
| KR | 10-2017-0002790 A | 1/2017 |

* cited by examiner

*Primary Examiner* — Douglas W Owens
(74) *Attorney, Agent, or Firm* — Lewis Roca Rothgerber Christie LLP (57) ABSTRACT

A display apparatus includes: a substrate comprising a display area and a non-display area; and a pad on the non-display area, wherein the pad comprises: a first conductive layer comprising, in a plan view, a plurality of bent portions and a plurality of connection portions connecting the plurality of bent portions with each other, the connection portions alternately extending in a first direction and a second direction opposite to the first direction; a second conductive layer on the first conductive layer and overlapping at least part of the first conductive layer; and a third conductive layer on the second conductive layer and overlapping the second conductive layer.

20 Claims, 11 Drawing Sheets

DISPLAY APPARATUS

CROSS-REFERENCE TO RELATED APPLICATION

This application claims priority to and the benefit of Korean Patent Application No. 10-2019-0074122, filed on Jun. 21, 2019, in the Korean Intellectual Property Office, the disclosure of which is incorporated herein in its entirety by reference.

BACKGROUND

1. Field

Aspects of one or more example embodiments relate to a display apparatus.

2. Description of Related Art

As the information society develops, demand for display apparatuses for displaying images in various forms has increased. Furthermore, the thickness and the weight of display apparatuses has reduced, and thus, the range of a uses thereof has increased.

In display apparatuses, to increase the size of a display area, technologies have been developed such that a lower non-display area, a so-called dead space, may be gradually decreased. To reduce a dead space in a lower end of a display apparatus, the sizes of elements located at the lower end of the display apparatus may be reduced or the elements may be moved to an edge of the display apparatus.

The above information disclosed in this Background section is only for enhancement of understanding of the background and therefore the information discussed in this Background section does not necessarily constitute prior art.

SUMMARY

Aspects of one or more example embodiments relate to a display apparatus, and for example, to a display apparatus having relatively improved product reliability.

However, in a display apparatus according to the related art, when elements located at a lower end of a display apparatus are moved to an edge of the display apparatus, operation failure may occur due to static electricity.

One or more example embodiments includes a display apparatus having improved product reliability and capable of preventing or reducing damage to the display apparatus. However, the above disclosure is merely an example, and the scope of the disclosure is not limited thereto.

Additional aspects will be set forth in part in the description which follows and, in part, will be apparent from the description, or may be learned by practice of the presented example embodiments of the disclosure According to one or more example embodiments, a display apparatus includes a substrate including a display area and a non-display area, and a pad on the non-display area, in which the pad includes a first conductive layer including, in a plan view, a plurality of bent portions and a plurality of connection portions connecting the plurality of bent portions with each other, the connection portions alternately extending in a first direction and a second direction opposite to the first direction, a second conductive layer on the first conductive layer to overlap at least part of the first conductive layer, and a third conductive layer on the second conductive layer to overlap the second conductive layer to prevent damage to the display apparatus due to static electricity by increasing resistance of a line, thereby improving product reliability of the display apparatus.

According to some example embodiments, the first conductive layer may have resistance of 1 megaohm (MΩ) or greater.

According to some example embodiments, a width of the first conductive layer in the first direction or the second direction may be less than a width of the second conductive layer in a same direction.

According to some example embodiments, an end portion of the first conductive layer may match an end portion of the substrate.

According to some example embodiments, the second conductive layer may have an island shape.

According to some example embodiments, the display apparatus may further include a first insulating layer between the first conductive layer and the second conductive layer, and a second insulating layer between the second conductive layer and the third conductive layer.

According to some example embodiments, the third conductive layer may be connected to the second conductive layer via a first contact hole defined in the second insulating layer.

According to some example embodiments, the third conductive layer may be connected to the first conductive layer via a second contact hole defined in the first insulating layer and the second insulating layer.

According to some example embodiments, the second contact hole may be located at an edge of the first conductive layer.

According to some example embodiments, an upper surface of the third conductive layer may be exposed.

According to some example embodiments, in a plan view, a size of the third conductive layer may be greater than a size of the second conductive layer.

According to some example embodiments, the second conductive layer may completely overlap the third conductive layer.

According to some example embodiments, the display apparatus may further include a pixel on the display area and electrically connected to a pixel circuit, the pixel circuit including a thin film transistor and a storage capacitor, in which the thin film transistor may include a semiconductor layer, a gate electrode at least partially overlapping the semiconductor layer, and an electrode layer connected to the semiconductor layer, and the first conductive layer may include a same material as the semiconductor layer.

According to some example embodiments, the second conductive layer may include a same material as the gate electrode.

According to some example embodiments, the third conductive layer may include a same material as the electrode layer.

According to some example embodiments, the pad may include a lighting pad for performing a lighting test.

According to one or more example embodiments, a display apparatus includes a substrate including a display area and a non-display area, and a plurality of pads arranged in the non-display area in a first direction and having a center axis in a third direction crossing the first direction, in which each of the plurality of pads includes a first conductive layer including, in a plan view, a plurality of bent portions and a plurality of connection portions connecting the plurality of bent portions with each other, a second conductive layer on the first conductive layer to overlap at least part of the first conductive layer, and a third conductive layer on the second conductive layer to overlap the second conductive layer, in which the first conductive layer forms symmetry with respect to the center axis in an area overlapping the third conductive layer, extends from an end portion of the substrate in a third direction at one side with respect to the center axis of each of the plurality of pads such that the connection portions extend in the first direction and the second direction in a zigzag, and continuously extends in a fourth direction opposite to the third direction at another side with respect to the center axis of each of the plurality of pads such that the connection portions extend in the first direction and the second direction in a zigzag.

According to some example embodiments, the first conductive layer may have resistance of 1 megaohm (MΩ) or greater.

According to some example embodiments, some of the plurality of bent portions may be arranged to face each other with respect to the center axis.

According to some example embodiments, the second conductive layer may have an island shape.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Reference will now be made in more detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising" used herein specify the presence of stated features or components, but do not preclude the presence or addition of one or more other features or components. Furthermore, it will be understood that when a layer, region, or component is referred to as being "formed on" another layer, region, or component, it can be directly or indirectly formed on the other layer, region, or component.

Sizes of components in the drawings may be exaggerated for convenience of explanation. In other words, because sizes and thicknesses of components in the drawings are arbitrarily illustrated for convenience of explanation, the following example embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may be different directions that are not perpendicular to one another.

When a certain embodiment may be implemented differently, a specific process order may be performed differently from the described order. For example, two consecutively described processes may be performed substantially at the same time or performed in an order opposite to the described order.

Figure 1:
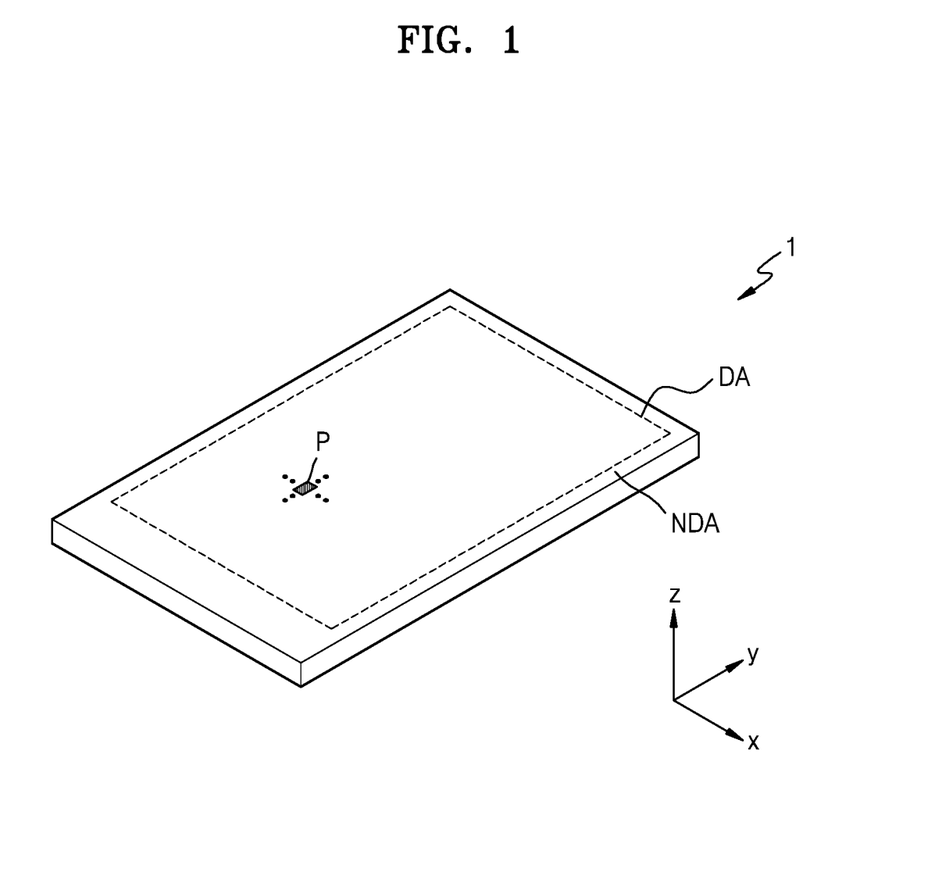
FIG. 1 is a schematic perspective view of a display apparatus according to some example embodiments.

FIG. 1 is a schematic perspective view of a display apparatus 1 according to some example embodiments.

Referring to FIG. 1, the display apparatus 1 may include a display area DA that implements an image and a non-display area NDA that does not implement an image. The display apparatus 1 may provide an image by using light emitted from a plurality of pixels P located in the display area DA.

Although FIG. 1 illustrates the display apparatus 1 having the display area DA that is rectangular, the disclosure is not limited thereto. The shape of the display area DA may be circular, oval, or polygonal such as triangular or pentagonal.

In the following description, although an organic light-emitting display apparatus is described as an example of the display apparatus 1 according to some example embodiments, the display apparatus according to the disclosure is not limited thereto. According to some example embodiments, various types of display apparatuses such as an inorganic electroluminescent (EL) display apparatus and a quantum dot light-emitting display apparatus may be used as the display apparatus according to some example embodiments of the disclosure. Furthermore, although a flat panel display apparatus is illustrated as the display apparatus 1 of FIG. 1, the display apparatus 1 may be implemented in various forms such as a flexible display apparatus, a foldable display apparatus, a rollable display apparatus, or any other suitable display apparatus.

Figure 2:
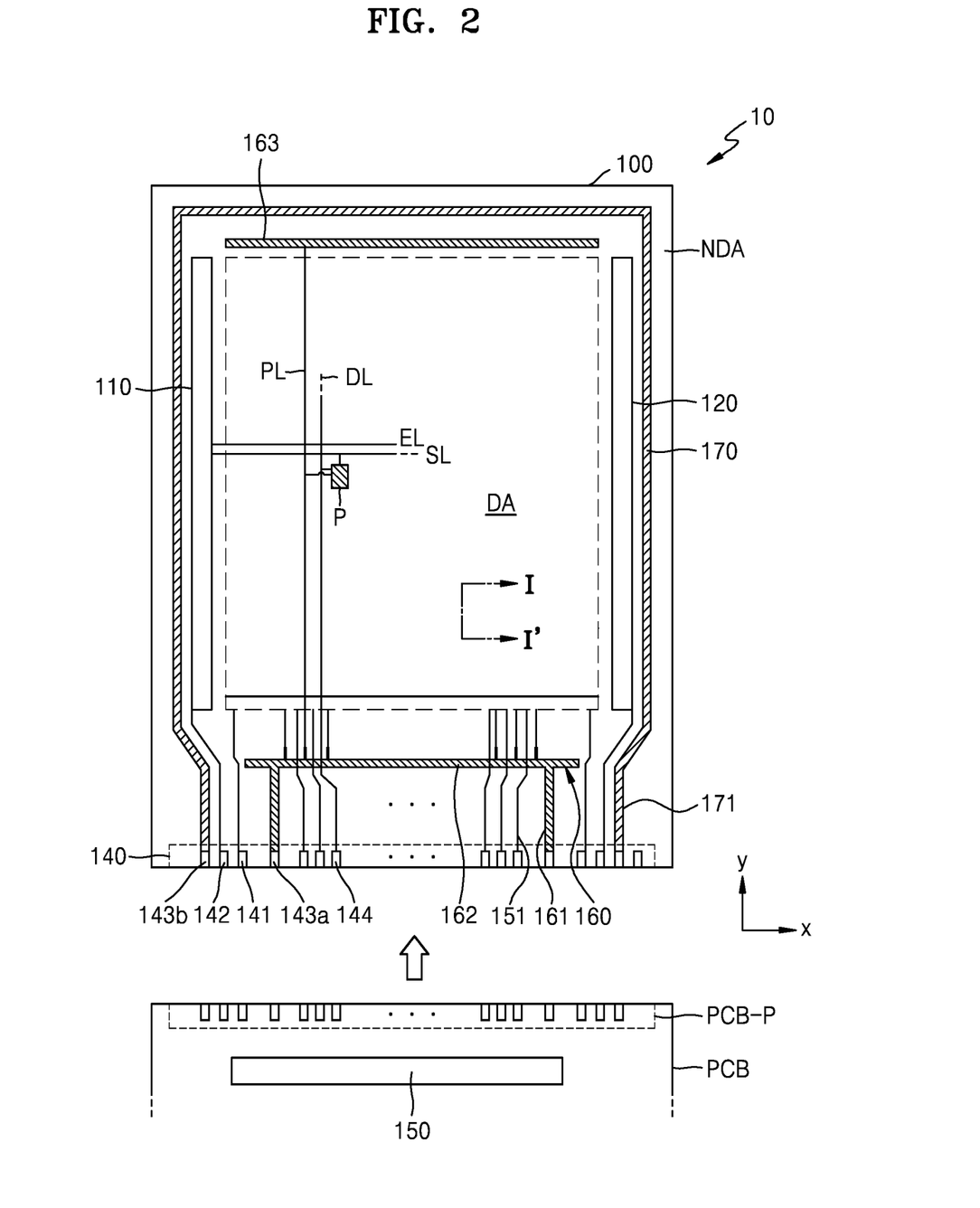
FIG. 2 is a schematic plan view of a display panel according to some example embodiments.

FIG. 2 is a schematic plan view of a display panel 10 according to some example embodiments.

Referring to FIG. 2, various elements constituting the display panel 10 are located on a substrate 100. The substrate 100 may include the display area DA and the non-display area NDA surrounding the display area DA.

A plurality of pixels P may be located in the display area DA. Each pixel P may include a display component such as an organic light-emitting diode (OLED). Each pixel P may emit, for example, red, green, blue, or white light, from the OLED. In the specification, the pixel P may be understood as a pixel that emits light of one of the colors such as red, green, blue, and white, as described above.

The pixels P may be electrically connected to outer circuits located in the non-display area NDA. A first scan driving circuit 110, a second scan driving circuit 120, a lighting test circuit, a pad portion 140, a data driving circuit 150, a first power supply line 160, and a second power supply line 170 may be located in the non-display area NDA.

The first scan driving circuit 110 may provide a scan signal to the pixel P via a scan line SL. The first scan driving circuit 110 may provide a light-emitting control signal to each pixel P via an emission control line EL. The second scan driving circuit 120 may be arranged parallel to the first scan driving circuit 110 with the display area DA therebetween. Some of the pixels P located in the display area DA may be electrically connected to the first scan driving circuit 110 and the others may be electrically connected to the second scan driving circuit 120. According to some example embodiments, the second scan driving circuit 120 may be omitted.

The lighting test circuit may be connected to a data line DL of the pixel P and may provide a lighting test signal to the data lines DL in a lighting test process. For example, when a lighting control signal DC_R of a first pixel is supplied to the lighting test circuit, a data signal may be supplied to the data lines DL of the first pixel so that the first pixel may emit light. Furthermore, when lighting control signals DC_G and DC_B of a second pixel or a third pixel are supplied to the lighting test circuit, a data signal may be supplied to the data lines DL of the second pixel or the third pixel so that the second pixel or the third pixel may emit light.

The pad portion 140 may be located at one side of the substrate 100. The pad portion 140 may include a lighting pad 141, a driving pad 142, power pads 143a and 143b, and a data pad 144. The pad portion 140 may be exposed without being covered with an insulating layer and electrically connected to a printed circuit board PCB.

Figure 3:
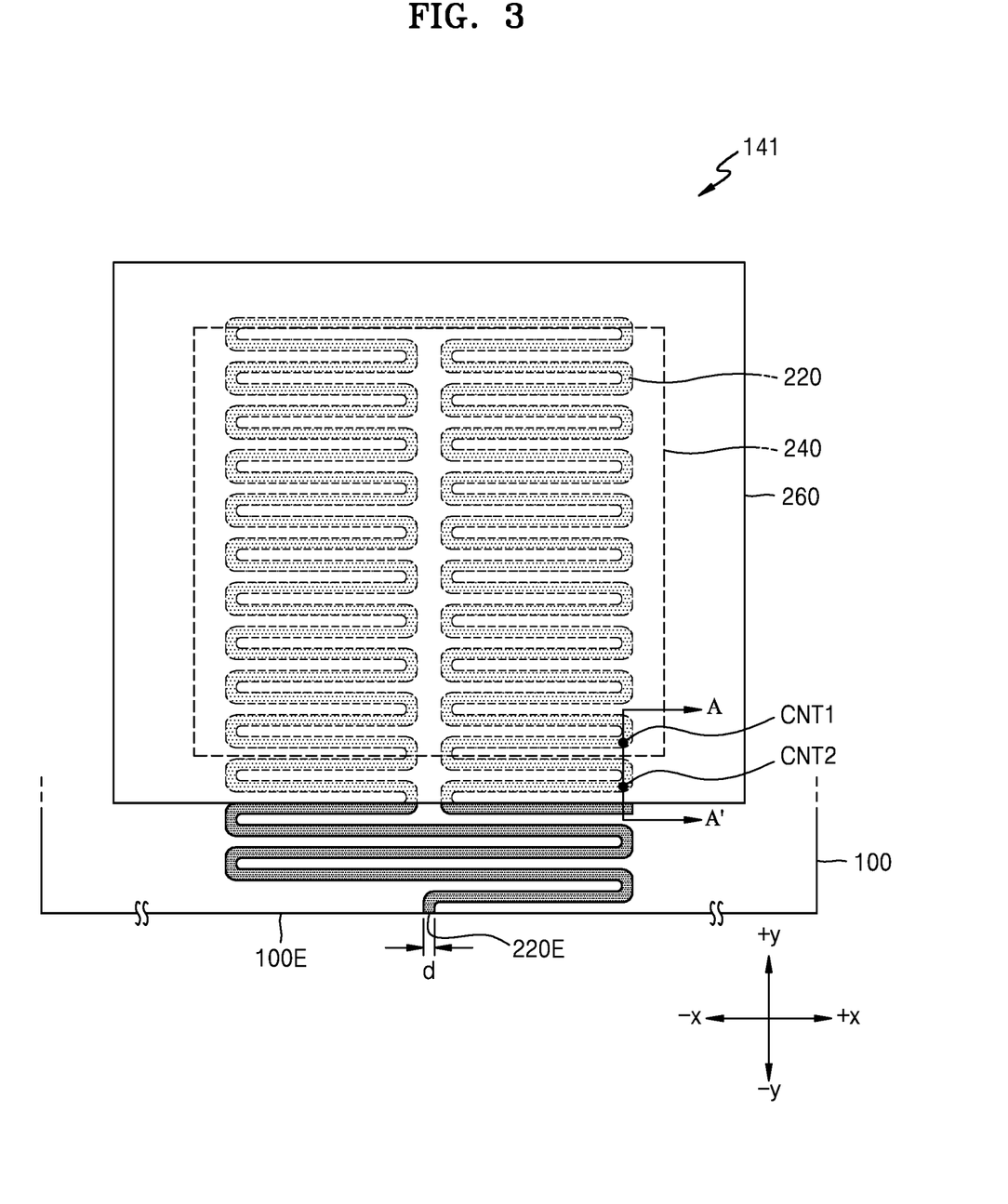
FIG. 3 is a plan view of a display apparatus according to some example embodiments.

Although FIG. 3 illustrates a case in which one lighting pad is provided as the lighting pad 141, the embodiments are not limited thereto and the lighting pad 141 may include a plurality of lighting pads.

A port PCB-P of the printed circuit board PCB may be electrically connected to the pad portion 140 of the display panel 10. The printed circuit board PCB may transmit a signal or power of a controller to the display panel 10 via the driving pad 142 or the power pads 143a and 143b. A control signal generated by the controller may be transmitted to each of the first and second scan driving circuits 110 and 120 via the driving pad 142. The controller may provide first and second power voltages ELVDD and ELVSS (see FIGS. 5 and 6 below) respectively to the first and second power supply lines 160 and 170 via the power pads 143a and 143b connected to first and second connection lines 161 and 171. The first power voltage ELVDD may be provided to the pixel P via a driving voltage line PL connected to the first power supply line 160, and the second power voltage ELVSS may be provided to a counter electrode of the pixel P connected to the second power supply line 170.

The data driving circuit 150 may be electrically connected to the data line DL. A data signal of the data driving circuit 150 may be provided to the pixel P via a connection line 151 connected to the data pad 144 and the data line DL connected to the connection line 151. Although FIG. 2 illustrates that the data driving circuit 150 is located on the printed circuit board PCB, according to some example embodiments, the data driving circuit 150 may be located on the substrate 100. For example, the data driving circuit 150 may be located between the pad portion 140 and the first power supply line 160.

The first power supply line 160 may include a first sub-line 162 and a second sub-line 163, which extend parallel to an x direction with the display area DA therebetween. The second power supply line 170 may have a loop shape with one open side and may partially surround the display area DA.

Figure 4:
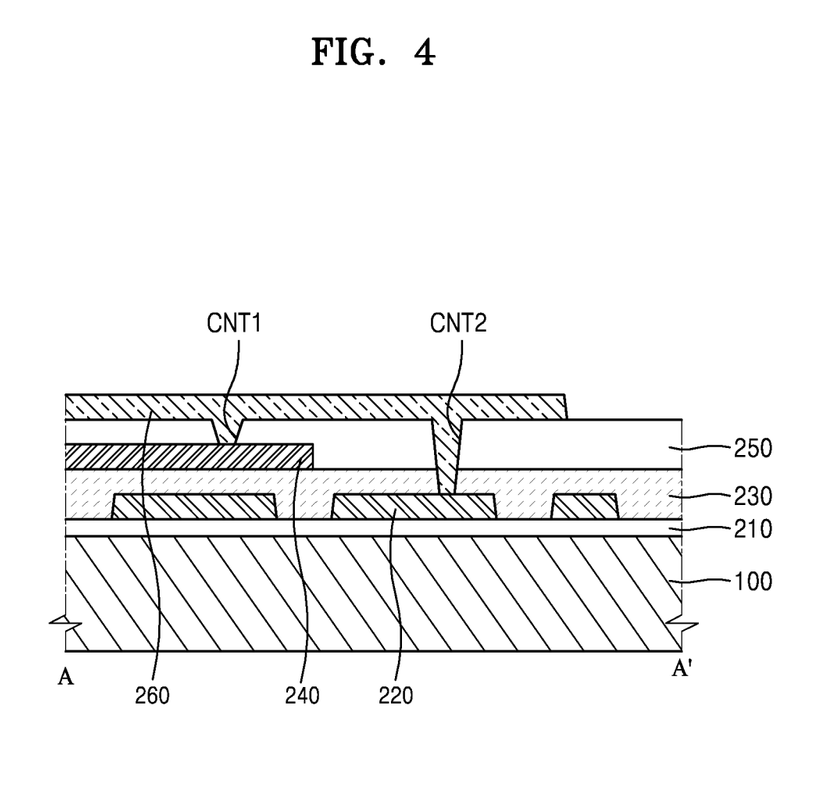
FIG. 4 is a cross-sectional view taken along the line A-A' of FIG. 3.

FIG. 3 is a plan view of the display apparatus 1 according to some example embodiments, and FIG. 4 is a cross-sectional view taken along the line A-A' of FIG. 3.

Referring to FIGS. 3 and 4, the display apparatus 1 according to an embodiment may include the substrate 100 including the display area DA and the non-display area NDA and the lighting pad 141 located in the non-display area NDA, and the lighting pad 141 may include a buffer layer 210, a first conductive layer 220, a first insulating layer 230, a second conductive layer 240, a second insulating layer 250, and a third conductive layer 260.

The substrate 100 may include glass or polymer resin. The polymer resin may include polyethersulphone (PES), polyacrylate, polyetherimide (PEI), polyethylene naphthalate polyethylene naphthalate (PEN), polyethyeleneterepthalate (PET), polyphenylene sulfide (PPS), polyarylate (PAR), polyimide (PI), polycarbonate (PC), or cellulose acetate propionate (CAP). The substrate 100 including polymer resin may be flexible, rollable, or bendable. The substrate 100 may have a multilayer structure including the above-described layer including polymer resin and an inorganic layer.

The buffer layer 210 may be located on the substrate 100, and may reduce or prevent intrusion of foreign materials, moisture, or external air from the lower side of the substrate 100 and may provide a planarized surface on the substrate 100. The buffer layer 210 may include an inorganic material such as oxide or nitride, an organic material, or an organic/inorganic composite, and may have a single layer or multilayer structure of an inorganic material and an organic material. A barrier layer for blocking the intrusion of external air may be further provided between the substrate 100 and the buffer layer 210.

The first conductive layer 220 may be located on the buffer layer 210. For example, the first conductive layer 220 may include, on a plane or in a plan view, a plurality of bent portions and a plurality of connection portions connecting the bent portions, and the connection portions may be located on the buffer layer 210 by alternately extending in a first direction (+x) and a second direction (−x) that is opposite to the first direction (+x).

Furthermore, an end portion of the first conductive layer 220 may match an end portion of the substrate 100. For example, as illustrated in FIG. 3, an end portion 220E of the first conductive layer 220 may match an end 100E of one side of the substrate 100.

In the display apparatus, to increase the size of a display area, technologies have been developed such that a lower non-display area or a so-called dead space is gradually decreased. To reduce the dead space at the lower end of the display apparatus, the sizes of elements located at the lower end of the display apparatus are reduced and the elements are located at an edge of the display apparatus. However, when a static electricity test is performed after the elements located at the lower end of the display apparatus are located at the edge of a display, abnormal driving may occur due to static electricity generated at the lower end portion of the display apparatus.

Accordingly, to address the above matter, static electricity intruding into the display apparatus 1 may be prevented or reduced by increasing the resistance of the first conductive layer 220, and thus abnormal driving of the display apparatus 1 due to the static electricity may be prevented or reduced.

Electrical resistance is a physical quantity indicating a degree of interruption of flow of a current in a conductive body, which is simply referred to as resistance. In general, the resistance of an object increases as resistivity increases, the length of the object increases, and the section of the object decreases. When the resistivity, the length, and the section of a certain material are ρ, L, and A, respectively, the size of resistance R may be defined by Equation 1 below.

$$R = \rho \frac{L}{A} \quad \text{Equation 1}$$

In an electric circuit, resistance interrupts flow of a current, thereby causing a voltage drop.

Accordingly, the resistance of the first conductive layer 220 may be increased by increasing the length of the first conductive layer 220 and reducing a cross-section thereof by reducing the width of the first conductive layer 220, and accordingly, the first conductive layer 220 may delay static electricity from intruding into the display apparatus 1, thus abnormal driving of, or damage to, the display apparatus 1 due to static electricity may be prevented or reduced.

To increase the resistance of the first conductive layer 220, the width d of the first conductive layer 220 may be decreased, and the total length of the first conductive layer 220 may be increased.

However, the decreasing of the width d of the first conductive layer 220 unlimitedly and the increasing of the total length of the first conductive layer 220 unlimitedly may be limited due to the size of the area occupied by the first conductive layer 220.

Accordingly, the width d of the first conductive layer 220 may be equal to or less than 2 μm, and as the connection portions included in the first conductive layer 220 may alternately extend in the first direction (+x) and the second direction (−x) in an area where the first conductive layer 220 is located, the first conductive layer 220 may have resistance of 1 megaohm (MΩ) or greater.

Accordingly, as the first conductive layer 220 may have resistance of 1 megaohm (MΩ) or greater, static electricity may be delayed from intruding into the display apparatus 1 and thus abnormal driving of the display apparatus 1 due to static electricity may be prevented or reduced.

The total width of the first conductive layer 220 in which the connection portions are arranged by alternately extending in the first direction (+x) and the second direction (−x) may be less than the width of the second conductive layer 240 that is described below, and at least part of the first conductive layer 220 may be arranged to overlap the second conductive layer 240, or the first conductive layer 220 may be arranged to completely overlap the second conductive layer 240.

The display apparatus 1 according to some example embodiments may include the substrate 100 including the display area DA and the non-display area NDA and a plurality of pads located in the non-display area NDA in the first direction (+x), having a center axis in a third direction (+y) crossing the first direction (+x), and each of the pads may include the first conductive layer 220 having, on a plane (or in a plan view), the plurality of bent portions and the connection portions connecting the plurality of bent portions with each other, the second conductive layer 240 located above the first conductive layer 220 to overlap with at least part of the first conductive layer 220, and the third conductive layer 260 located above the second conductive layer 240 to overlap the second conductive layer 240.

The lighting pad 141 according to some example embodiments may have a center axis that extends in the third direction (+y) crossing the first direction (+x) or the second direction (−x) that is opposite to the first direction (+x).

As illustrated in FIG. 3, the first conductive layer 220 may include, on a plane (or in a plan view), the plurality of bent portions and the connection portions connecting the plurality of bent portions with each other, forming symmetry with respect to the center axis in an area overlapping the third conductive layer 260, extending from the end 100E of the substrate 100 in the third direction (+y) at one side with respect to the center axis of the lighting pad 141 such that the connection portions extend in the first direction (+x) and the second direction (−x) in a zigzag, and continuously extending in a fourth direction (−y) that is opposite to the third direction (+y) at the other side with respect to the center axis of the lighting pad 141 such that the connection portions extend in the first direction (+x) and the second direction (−x) in a zigzag.

The first conductive layer 220 may include an oxide semiconductor and/or a silicon semiconductor. When the first conductive layer 220 is formed of an oxide semiconductor, for example, an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the first conductive layer 220 may be ITZO (InSnZnO) or IGZO (InGaZnO). When the first conductive layer 220 is formed of a silicon semiconductor, for example, amorphous silicon (a-Si) or low temperature poly-silicon (LTPS) obtained by crystallizing amorphous silicon (a-Si).

The second conductive layer 240 may be located above the first conductive layer 220 with the first insulating layer 230 therebetween. The first insulating layer 230 may include at least one inorganic insulating material selected from the group consisting of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 230 may include a single layer or a multilayer including the above-described inorganic insulating material.

As illustrated in FIG. 3, the second conductive layer 240 may be located on the first insulating layer 230 in a shape of an island electrode or a floating electrode. For example, the second conductive layer 240 may be located between the first insulating layer 230 and the second insulating layer 250 in a shape of an island electrode or a floating electrode without being connected to any layer other than the third conductive layer 260 via the first contact hole CNT1 that is described below.

The second conductive layer 240 may include the same material as a gate electrode G (see FIG. 5) that is described below.

The second insulating layer 250 may be located on the second conductive layer 240. The second insulating layer 250 may be provided to cover the second conductive layer 240 and may be connected to the second conductive layer 240 and the third conductive layer 260 that is described below, via the first contact hole CNT1 defined in the second insulating layer 250.

The second insulating layer 250 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The third conductive layer 260 may be located on the second insulating layer 250. The third conductive layer 260 may be connected to the second conductive layer 240 via the first contact hole CNT1 defined in the second insulating layer 250, and to the first conductive layer 220 via a second contact hole CNT2 defined in the first insulating layer 230 and the second insulating layer 250. In this state, as the second contact hole CNT2 may be located at an edge of the first conductive layer 220, even when static electricity intrudes into the first conductive layer 220, a path to reach the second contact hole CNT2 is long so that as the static electricity is transferred to the elements constituting the display apparatus 1, occurrences of abnormal driving or damage to the display apparatus 1 may be prevented or reduced.

The third conductive layer 260 is located without being covered by the insulating layer, and thus an upper surface of the third conductive layer 260 may be exposed to the outside. After manufacturing the display apparatus 1, a lighting test is performed through the upper surface of the third conductive layer 260 that is exposed to the outside, and thus the driving of the display area DA included in the display apparatus 1 may be checked. For example, a test signal is applied to the third conductive layer 260 by using a probe, and the third conductive layer 260 may transfer the applied test signal to the lighting test circuit connected to the third conductive layer 260, thereby testing driving (light-emitting) of the pixel P of the display area DA.

As illustrated in FIG. 3, on a plane (or from a plan view), the width of the third conductive layer 260 may be greater than the width of the second conductive layer 240. In this case, the second conductive layer 240 may be arranged to completely overlap the third conductive layer 260.

Furthermore, in an area where the first conductive layer 220 overlaps the second conductive layer 240 or the third conductive layer 260, the first conductive layer 220 may be symmetrically arranged with respect to the center axis of the lighting pad 141. The bent portions included in the first conductive layer 220 may be partially arranged to face each other with respect to the center axis.

Figure 5:
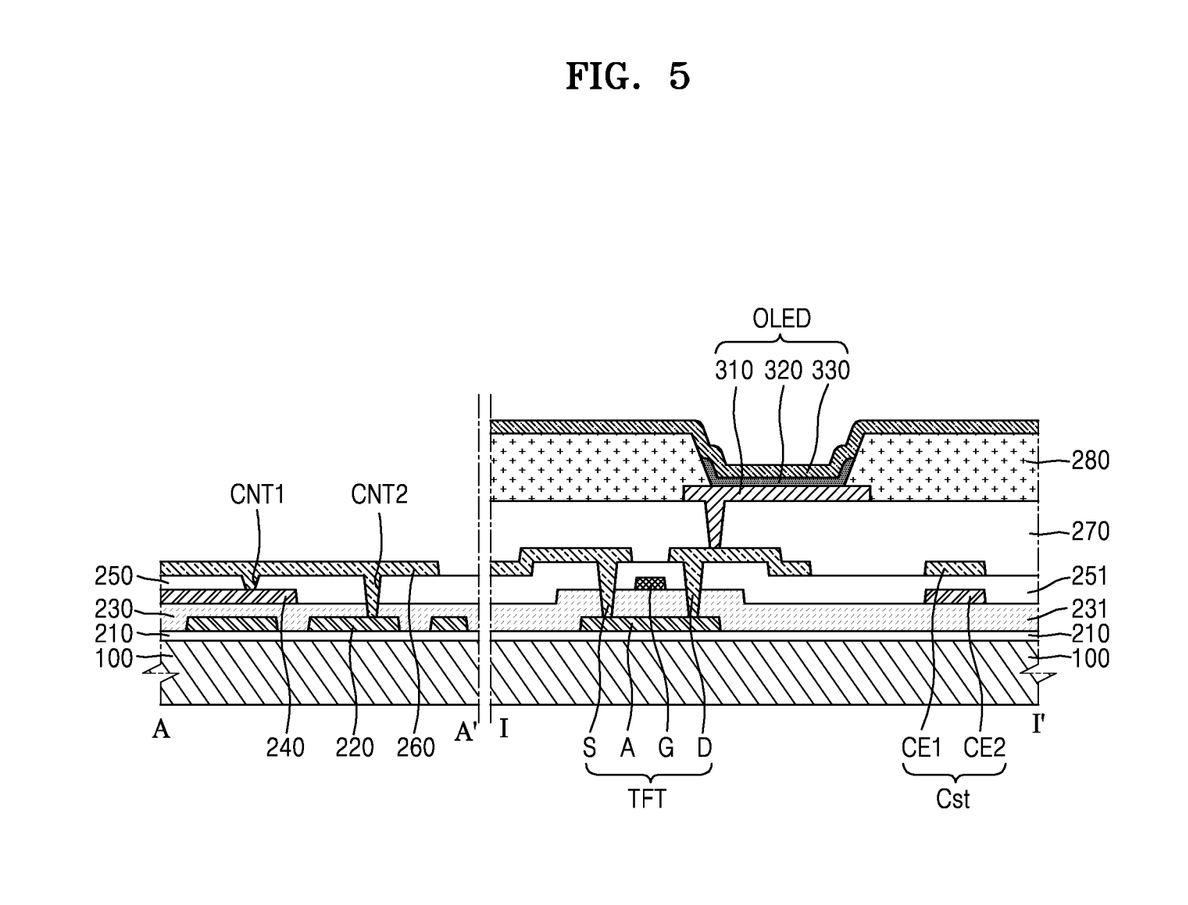
FIG. 5 are cross-sectional views along the line I-I' of FIG. 2 and the line A-A' of FIG. 3.

FIG. 5 are cross-sectional views along line I-I' of FIG. 2 and line A-A' of FIG. 3.

A stack structure of the display apparatus 1 according to some example embodiments in the display area DA is described in more detail with reference to FIG. 5.

The buffer layer 210 may be located on the substrate 100, and a thin film transistor (TFT) may be located on the buffer layer 210. The TFT may include a semiconductor layer A, a gate electrode G, and an electrode layer.

Although FIG. 5 illustrates a case in which the TFT is a top gate type, the embodiments are not limited thereto, and various types of thin film transistors TFT such as a bottom gate type may be employed.

Furthermore, although FIG. 5 illustrates a case in which the TFT includes one TFT, the disclosure is not limited thereto. In the embodiments, the display apparatus 1 may include two or more TFTs for one pixel P. In some embodiments, seven thin film transistors TFT may be used for one pixel P.

The semiconductor layer A may include, for example, amorphous silicon (a-Si) or low temperature poly silicon (LTPS) obtained by crystallizing the amorphous silicon (a-Si). Furthermore, the semiconductor layer A may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the first conductive layer 220 may include ITZO (InSnZnO) and IGZO (InGaZnO).

According to some example embodiments, the semiconductor layer A of the display area DA may include the same material as the above-described first conductive layer 220.

The gate electrode G may be located on the semiconductor layer A with a gate insulating layer 231 therebetween. The gate electrode G may include a single layer or a multilayer of at least one metal material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The gate electrode G may be connected to a gate line for applying an electric signal to the gate electrode G.

According to some example embodiments, the gate electrode G may include the same material as the above-described second conductive layer 240.

The gate insulating layer 231, which is a layer for insulating the semiconductor layer A from the gate electrode G, may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The gate insulating layer 231 may include a single layer or a multilayer including the above-described inorganic insulating material.

According to some example embodiments, the gate insulating layer 231 of the display area DA may include the same material as the first insulating layer 230 described above.

The electrode layer may be located on the gate electrode G with an interlayer insulating layer 251 therebetween. The electrode layer may include a source electrode S and/or a drain electrode D. The source electrode S and/or the drain electrode D may be electrically connected to the semiconductor layer A via contact holes formed in the interlayer insulating layer 251 and the gate insulating layer 231.

The electrode layer including the source electrode S and/or the drain electrode D may include a single layer or a multilayer of at least one metal material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). According to some example embodiments, the electrode layer may have a multilayer structure of Ti/Al/Ti.

According to some example embodiments, when the electrode layer including the source electrode S and/or the drain electrode D of the display area DA is formed, the third conductive layer 260 described above may be simultaneously formed of an identical material.

The interlayer insulating layer 251 may include at least one selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

According to some example embodiments, when the interlayer insulating layer 251 is formed, the above-described second insulating layer 250 may be simultaneously formed of an identical material.

A first electrode CE1 and a second electrode CE2 of a storage capacitor Cst may be arranged to overlap each other with the interlayer insulating layer 251 therebetween.

According to some example embodiments, the second electrode CE2 may be located on the same layer as the gate electrode G.

Although FIG. 5 illustrates that the storage capacitor Cst does not overlap the TFT, the disclosure is not limited thereto. For example, the storage capacitor Cst may be arranged to overlap the TFT. In some embodiments, the second electrode CE2 of the storage capacitor Cst may be integrally formed with the gate electrode G. In other words, the gate electrode G of the TFT may perform a function of the second electrode CE2 of the storage capacitor Cst.

Referring back to FIG. 5, a planarization layer 270 may be located on the interlayer insulating layer 251. Although FIG. 5 illustrates the planarization layer 270 as a single layer, the planarization layer 270 may include a multilayer. The planarization layer 270 may planarize an upper surface of a pixel circuit (PC) and may planarize a surface where the OLED is to be located.

The planarization layer 270 may include general purpose polymer such as benzocyclobutene (BCB), polyimide, hexamethyldisiloxane (HMDSO), polymethylmethacrylate (PMMA), and polystyrene (PS), polymer derivatives having a phenol-based group, acrylic-based polymer, imide-based polymer, aryl ether-based polymer, amide-based polymer, fluorine-based polymer, p-xylene-based polymer, vinyl alcohol-based polymer, and a blend thereof. The planarization layer 270 may include an inorganic material. The planarization layer 270 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 270 includes an inorganic material, chemical planarization polishing may be performed as occasion demands. The planarization layer 270 may include both an organic material and an inorganic material.

In the display area DA of the substrate 100, the OLED including a pixel electrode 310, an intermediate layer 320, and a counter electrode 330 located opposite to the pixel electrode 310 with the intermediate layer 320 therebetween may be located on the planarization layer 270.

The pixel electrode 310 may be located on the planarization layer 270. The pixel electrode 310 may include a (semi-)transmissive electrode or a reflective electrode. In some example embodiments, the pixel electrode 310 may include a reflective film formed of Ag, Mg, Al, Pt, Pd, Au, Ni, Nd, Ir, Cr, or a compound thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 310 may have a stack structure of ITO/Ag/ITO.

A pixel defining layer 280 may be located on the planarization layer 270, and the pixel defining layer 280 has an opening such that a center portion of the pixel electrode 310 is exposed, thereby defining a light-emitting area of a pixel. Furthermore, the pixel defining layer 280 may prevent or reduce generation of an arc at an edge of the pixel electrode 310 by increasing a distance between the edge of the pixel electrode 310 and the counter electrode 330 above the pixel electrode 310. The pixel defining layer 280 may be formed of an organic insulating material, for example, polyimide, polyamide, acryl resin, benzocyclobutene, HMDSO, and phenol resin by a method such as spin coating.

The intermediate layer 320 may be located on the pixel electrode 310 exposed by the pixel defining layer 280. The intermediate layer 320 may include an emission layer and may optionally further include a function layer under and above the emission layer, for example, a hole transport layer (HTL), a hole injection layer (HIL), an electron transport layer (ETL), and an electron injection layer (EIL).

The emission layer may include an organic material including a fluorescent or phosphorescent material that emits red, green, blue, or white light. The emission layer may include a low molecular organic material or a polymer organic material.

When the emission layer includes a low molecular organic material, the intermediate layer 320 may have a stack structure of a hole injection layer (HIL), a hole transport layer (HTL), an emission layer (EML), an electron transport layer (ETL), and an electron injection layer (EIL) in a single or composite structure, and the low molecular organic material may include various organic materials such as copper phthalocyanine (CuPc), N,N'-Di(napthalene-1-yl)-N,N'-diphenyl-benzidine (NPB), or tris-8-hydroxyquinoline aluminum (Alq3). These layers may be formed by a method such as vacuum deposition.

When the emission layer includes a polymer material, the intermediate layer 320 may generally have a structure including an HTL and an emission layer (EML). In this state, the HTL may include PEDOT, and the emission layer may include a poly-phenylenevinylene (PPV)-based or polyfluorene-based polymer material. The emission layer may be formed by a screen print or inkjet print method or a laser induced thermal imaging (LITI) method.

The pixel electrode 310 may include a plurality of pixel electrodes, and the intermediate layer 320 may be arranged corresponding to each of the pixel electrodes 310. However, the disclosure is not limited thereto. The intermediate layer 320 may be variously modified, for example, by including an integrated layer over the pixel electrodes 310. According to some example embodiments, the intermediate layer 320 may be arranged corresponding to each of the pixel electrodes 310, and a functional layer(s) other than the intermediate layer 320 may be formed integrally over the pixel electrodes 310.

The counter electrode 330 may be located on the intermediate layer 320. The counter electrode 330 may be located on the intermediate layer 320 in the form of entirely covering the intermediate layer 320.

The counter electrode 330 may include a transmissive electrode or a reflective electrode. In some embodiments, the counter electrode 330 may include a transparent or semi-transparent electrode, and may be formed of a metal thin film having a small work function and comprising Li, Ca, LiF/Ca, LiF/Al, Al, Ag, Mg, or a compound thereof. Furthermore, a transparent conductive oxide (TCO) film such as ITO, IZO, ZnO, or $In_2O_3$ may be further located on metal thin film.

When the pixel electrode 310 is provided as a reflective electrode and the counter electrode 330 is provided as a transmissive electrode, light emitted from the intermediate layer 320 may be emitted toward the counter electrode 330, and thus the display apparatus 1 may be of a top emission type.

According to some example embodiments, when the pixel electrode 310 includes a transparent or semi-transparent electrode and the counter electrode 330 includes a reflective electrode, light emitted from the intermediate layer 320 may be emitted toward the substrate 100, and thus the display apparatus 1 may be of a bottom emission type. However, the disclosure is not limited thereto, and the display apparatus 1 according to some example embodiments may be of a dual emission type in which light is emitted in dual directions from the top surface and the bottom surface.

A thin film encapsulation layer is located on the counter electrode 330 so as to protect the OLED from external moisture and oxygen. The thin film encapsulation layer may include at least one organic encapsulation layer and at least one inorganic encapsulation layer.

The inorganic encapsulation layer may include silicon oxide, silicon nitride, and/or silicon oxynitride. The organic encapsulation layer may include polyethylene terephthalate, polyethylene naphthalate, polycarbonate, polyimide, polyethylene sulfonate, polyoxymethylene, polyarylate, hexamethyldisiloxane, acryl-based resin (for example, polymethylmethacrylate, polyacrylic acid, etc.) or a combination thereof.

Figure 6:
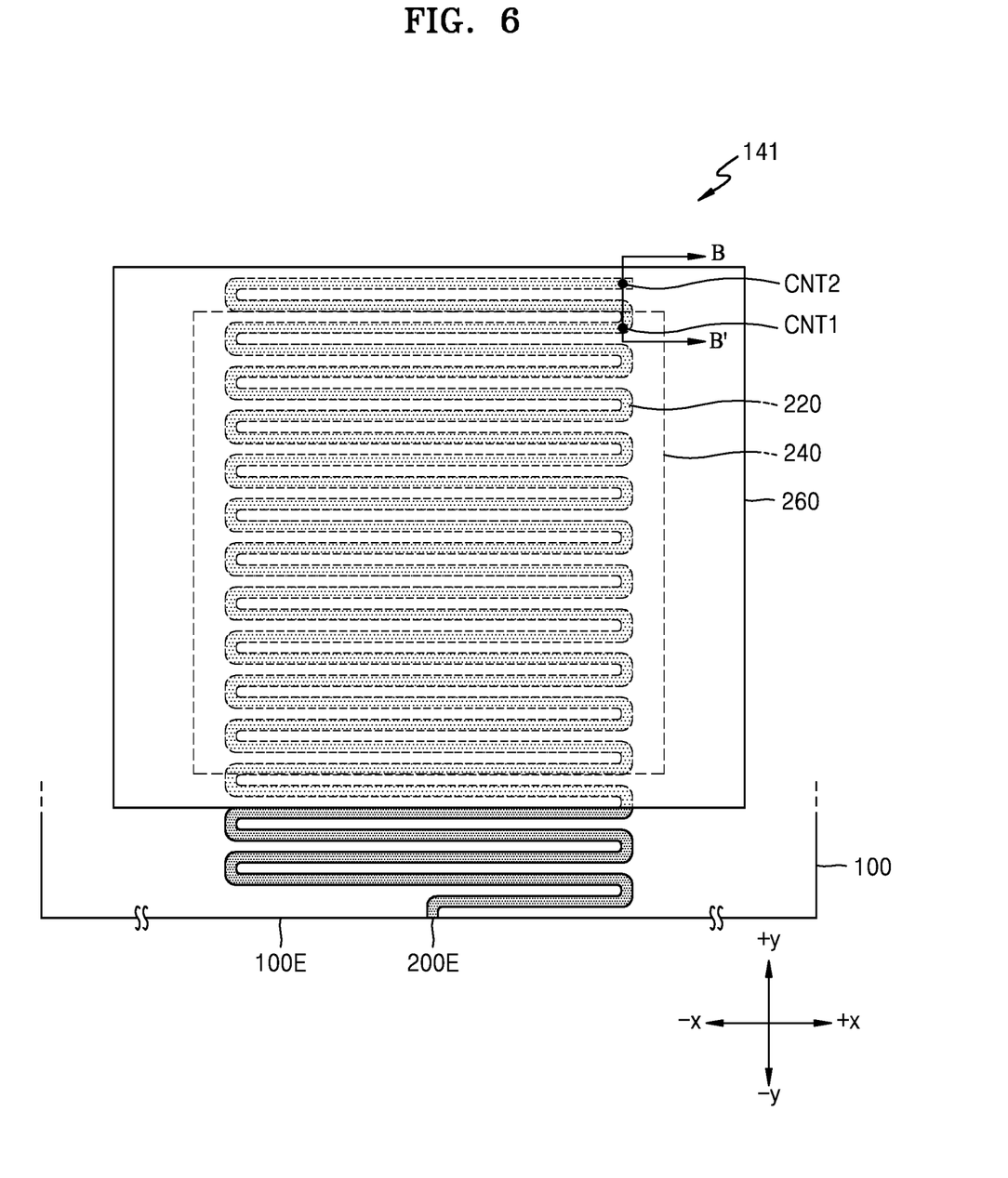
FIG. 6 is a plan view of a display apparatus according to some example embodiments.
Figure 7:
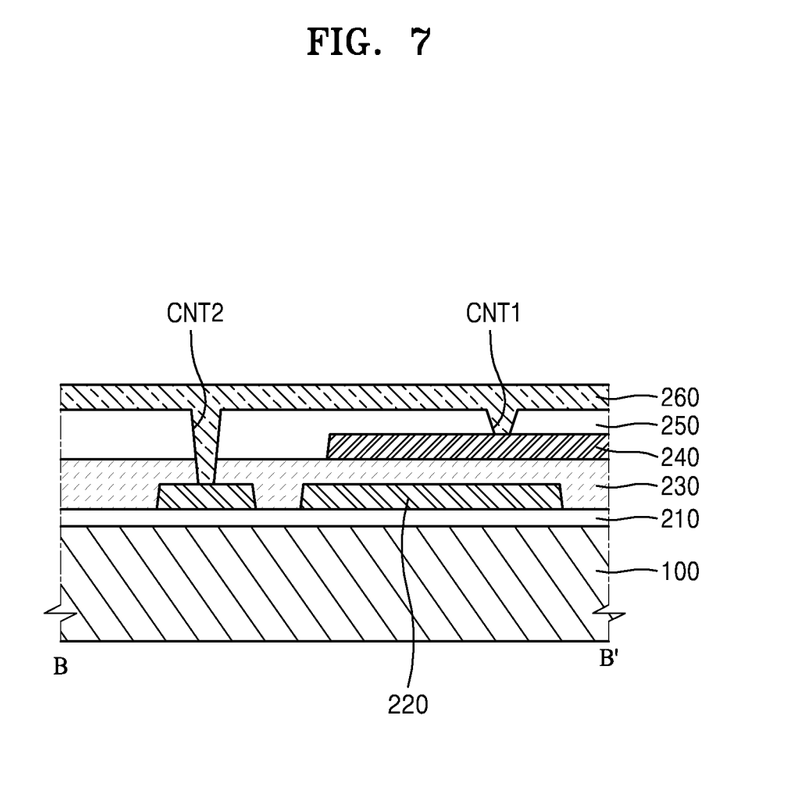
FIG. 7 is a cross-sectional view taken along the line B-B' of FIG. 6.

FIG. 6 is a plan view of the display apparatus 1 according to some example embodiments, and FIG. 7 is a cross-sectional view taken along line B-B' of FIG. 6.

The lighting pad 141 according to some example embodiments may have a center axis that extends in the third direction (+y) crossing the first direction (+x) or the second direction (−x) that is opposite to the first direction (+x).

Referring to FIGS. 6 and 7, the first conductive layer 220 of the lighting pad 141 of the display apparatus 1 according to some example embodiments may include, on a plane (or in a plan view), a plurality of bent portions and a plurality of connection portions connecting the bent portions with each other, may extend from the end portion of the substrate 100, and may be arranged in the third direction (+y) such that the connection portions alternately extend in the first direction (+x) and the second direction (−x) at one side with respect to the center axis of the lighting pad 141.

As illustrated in FIG. 7, the second conductive layer 240 and the third conductive layer 260 may be located on the first conductive layer 220. The third conductive layer 260 may be connected to the second conductive layer 240 via the first contact hole CNT1 defined in the second insulating layer 250, and to the first conductive layer 220 via the second contact hole CNT2 defined in the first insulating layer 230 and the second insulating layer 250. In this state, the second contact hole CNT2 may be located at an edge of the first conductive layer 220 that is separated farthest from the end portion of the substrate 100 in the first conductive layer 220.

Figure 8:
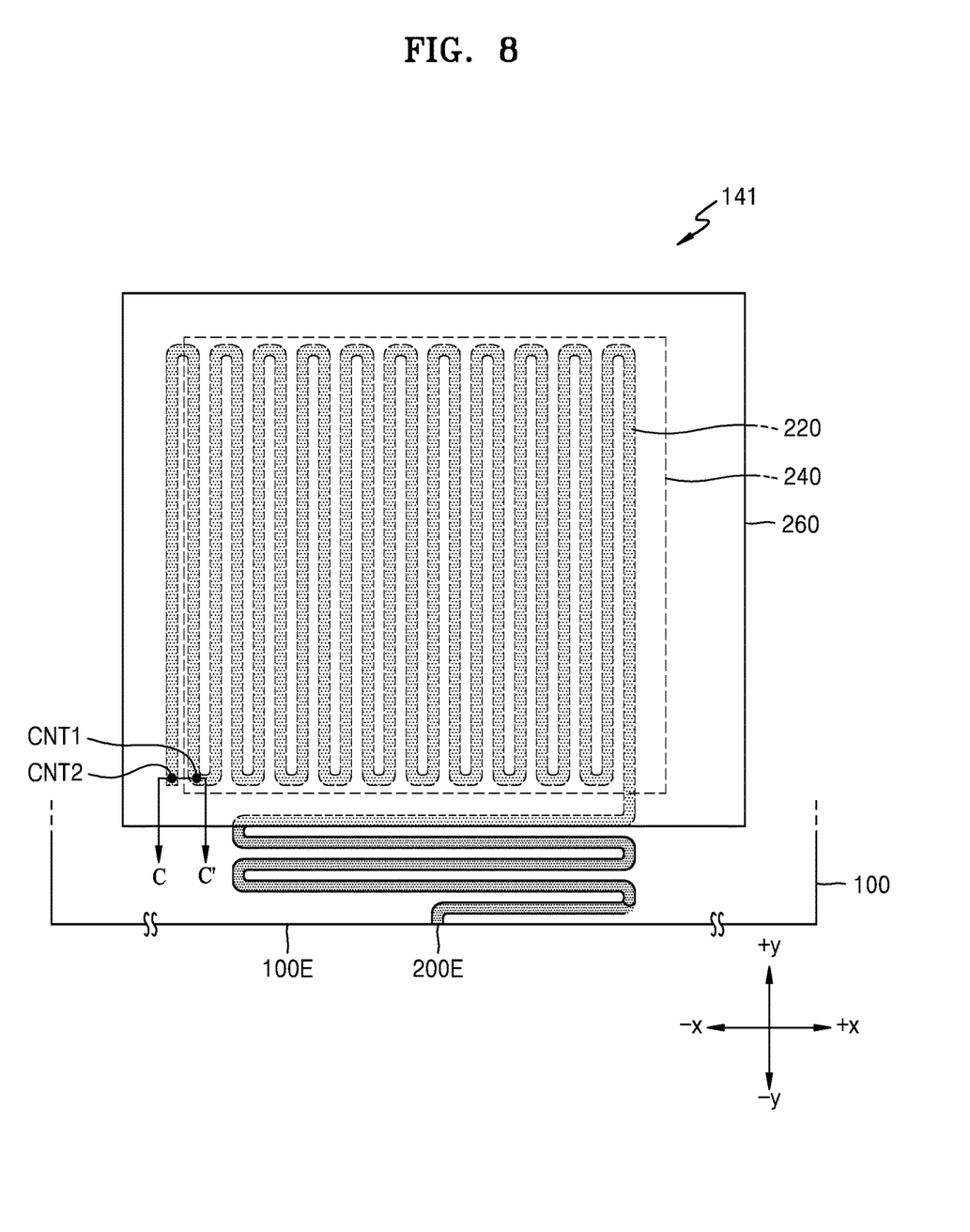
FIG. 8 is a plan view of a display apparatus according to some example embodiments.
Figure 9:
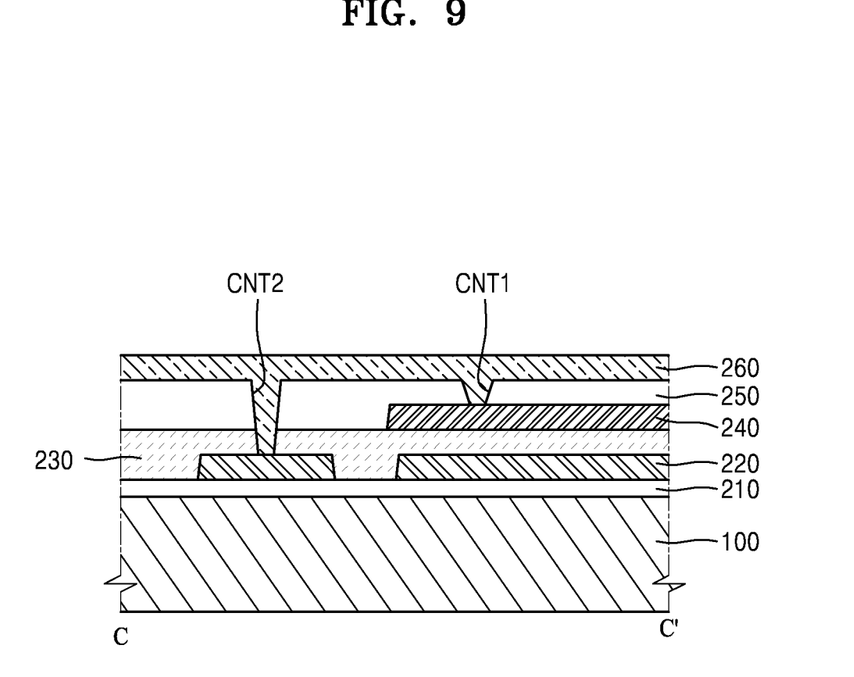
FIG. 9 is a cross-sectional view taken along the line C-C' of FIG. 8.

FIG. 8 is a plan view of the display apparatus 1 according to some example embodiments, and FIG. 9 is a cross-sectional view taken along line C-C' of FIG. 8.

The lighting pad 141 according to some example embodiments may have a center axis that extends in the third direction (+y) crossing the first direction (+x) or the second direction (−x) that is opposite to the first direction (+x).

Referring to FIGS. 8 and 9, the first conductive layer 220 of the lighting pad 141 of the display apparatus 1 according to some example embodiments may include, on a plane (or in a plan view), a plurality of bent portions and a plurality of connection portions connecting the bent portions with each other, may extend from the end portion of the substrate 100, and may be arranged in the second direction (−x) such that the connection portions alternately extend in the third direction (+y) and the fourth direction (−y) at one side with respect to the center axis of the lighting pad 141.

As illustrated in FIG. 9, the second conductive layer 240 and the third conductive layer 260 may be located on the first conductive layer 220. The third conductive layer 260 may be connected to the second conductive layer 240 via the first contact hole CNT1 defined in the second insulating layer 250, and to the first conductive layer 220 via the second contact hole CNT2 defined in the first insulating layer 230 and the second insulating layer 250. In this state, the second contact hole CNT2 may be located at the edge of the first conductive layer 220 that is separated farthest from the end portion of the substrate 100 in the first conductive layer 220.

Figure 10:
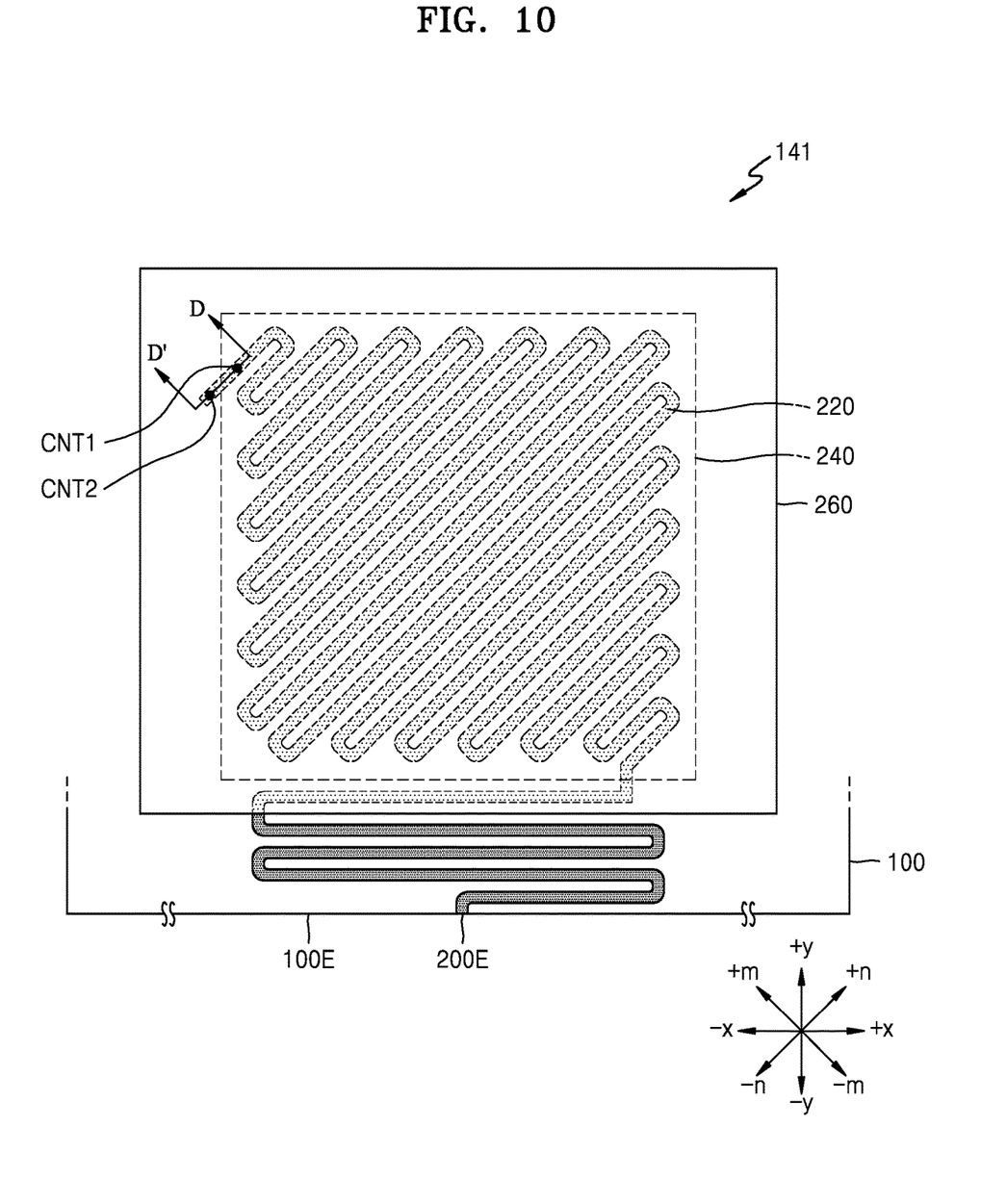
FIG. 10 is a plan view of display apparatus according to some example embodiments.
Figure 11:
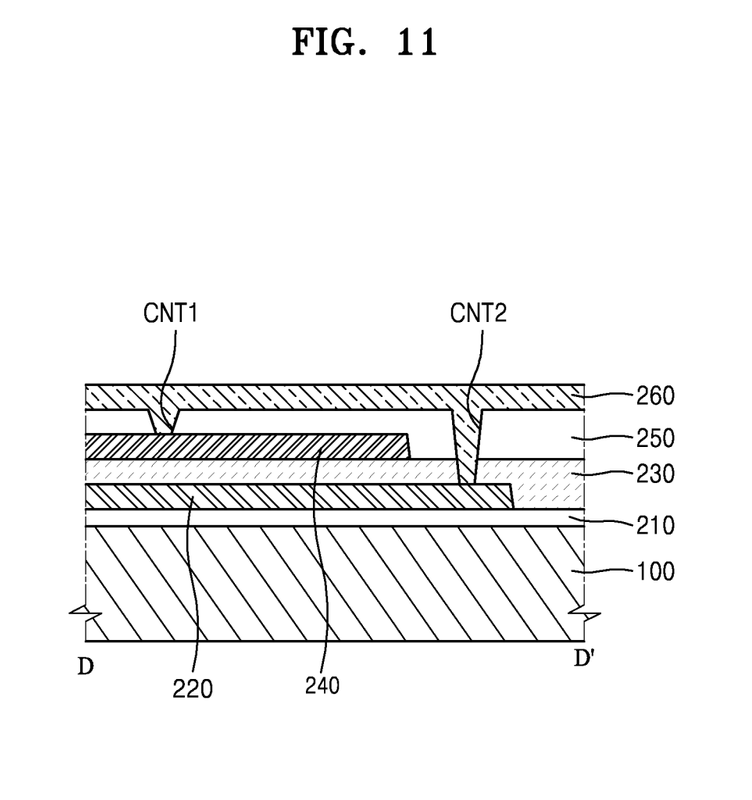
FIG. 11 is a cross-sectional view taken along the line D-D' of FIG. 10.

FIG. 10 is a plan view of the display apparatus 1 according to some example embodiments, and FIG. 11 is a cross-sectional view taken along line D-D' of FIG. 10.

The lighting pad 141 according to some example embodiments may have a center axis that extends in the third direction (+y) crossing the first direction (+x) or the second direction (−x) that is opposite to the first direction (+x).

Referring to FIGS. 10 and 11, the first conductive layer 220 of the lighting pad 141 of the display apparatus 1 according to some example embodiments may include, on a plane (or in a plan view), a plurality of bent portions and a plurality of connection portions connecting the bent portions with each other, may extend from the end portion of the substrate 100, and may be arranged in a seventh direction (+m) such that the connection portions alternately extend in a fifth direction (+n) and a sixth direction (−n) at one side with respect to the center axis of the lighting pad 141.

As illustrated in FIG. 11, the second conductive layer 240 and the third conductive layer 260 may be located on the first conductive layer 220. The third conductive layer 260 may be connected to the second conductive layer 240 via the first contact hole CNT1 defined in the second insulating layer 250, and to the first conductive layer 220 via the second contact hole CNT2 defined in the first insulating layer 230 and the second insulating layer 250. In this state, the second contact hole CNT2 may be located at the edge of the first conductive layer 220 that is separated farthest from the end portion of the substrate 100 in the first conductive layer 220.

According to some example embodiments, to solve a problem in the display apparatus according to the related art, that is, generation of a driving defect due to static electricity when the elements located at a lower end of the display apparatus are moved to the edge of a display, the length of a conductive layer is increased and the width thereof is reduced to have a small cross-section, thereby providing a display apparatus having a relatively improved product reliability and preventing or reducing damage to the display apparatuses.

Although only a display apparatus is mainly described above, the disclosure is not limited thereto. For example, a display apparatus manufacturing method to manufacture the above-described display apparatus may belong to the scope of the disclosure.

According to the above-described embodiments, by increasing resistance of a line, damage to a display apparatus due to static electricity may be prevented or reduced and a display apparatus having relatively improved product reliability may be implemented. The scope of the disclosure is not limited by the above-described effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate comprising a display area and a non-display area; and
a pad on the non-display area,
wherein the pad comprises:
a first conductive layer comprising, in a plan view, a plurality of bent portions and a plurality of connection portions connecting the plurality of bent portions with each other, the connection portions alternately extending in a first direction and a second direction opposite to the first direction;
a second conductive layer on the first conductive layer and overlapping at least part of the first conductive layer; and
a third conductive layer on the second conductive layer and overlapping the second conductive layer.

2. The display apparatus of claim 1, wherein the first conductive layer has resistance of 1 megaohm (MΩ) or greater.

3. The display apparatus of claim 1, wherein a width of the first conductive layer in the first direction or the second direction is less than a width of the second conductive layer in a same direction.

4. The display apparatus of claim 1, wherein an end portion of the first conductive layer matches an end portion of the substrate.

5. The display apparatus of claim 1, wherein the second conductive layer has an island shape.

6. The display apparatus of claim 1, further comprising:
a first insulating layer between the first conductive layer and the second conductive layer; and
a second insulating layer between the second conductive layer and the third conductive layer.

7. The display apparatus of claim 6, wherein the third conductive layer is connected to the second conductive layer through a first contact hole in the second insulating layer.

8. The display apparatus of claim 6, wherein the third conductive layer is connected to the first conductive layer through a second contact hole in the first insulating layer and the second insulating layer.

9. The display apparatus of claim 8, wherein the second contact hole is at an edge of the first conductive layer.

10. The display apparatus of claim 1, wherein an upper surface of the third conductive layer is exposed.

11. The display apparatus of claim 1, wherein a size of the third conductive layer is greater than a size of the second conductive layer in a plan view.

12. The display apparatus of claim 11, wherein the second conductive layer completely overlaps the third conductive layer.

13. The display apparatus of claim 1, further comprising:
a pixel on the display area and electrically connected to a pixel circuit, the pixel circuit comprising a thin film transistor and a storage capacitor,
wherein the thin film transistor comprises a semiconductor layer, a gate electrode at least partially overlapping the semiconductor layer, and an electrode layer connected to the semiconductor layer, and
the first conductive layer comprises a same material as the semiconductor layer.

14. The display apparatus of claim 13, wherein the second conductive layer comprises a same material as the gate electrode.

15. The display apparatus of claim 13, wherein the third conductive layer comprises a same material as the electrode layer.

16. The display apparatus of claim 1, wherein the pad comprises a lighting pad for performing a lighting test.

17. A display apparatus comprising:
a substrate comprising a display area and a non-display area; and
a plurality of pads in the non-display area and arranged along a first direction and, the plurality of pads having a center axis extending in a third direction crossing the first direction,
wherein each of the plurality of pads comprises:
a first conductive layer comprising, in a plan view, a plurality of bent portions and a plurality of connection portions connecting the plurality of bent portions with each other;
a second conductive layer on the first conductive layer and overlapping at least part of the first conductive layer; and
a third conductive layer on the second conductive layer and overlapping the second conductive layer,
wherein the first conductive layer is symmetrical with respect to the center axis in an area overlapping the third conductive layer, extends from an end portion of the substrate in a third direction at one side with respect to the center axis of each of the plurality of pads such that the connection portions extend in the first direction and a second direction in a zigzag, and continuously extends in a fourth direction opposite to the third direction at another side with respect to the center axis of each of the plurality of pads such that the connection portions extend in the first direction and the second direction in the zigzag.

18. The display apparatus of claim 17, wherein the first conductive layer has resistance of 1 megaohm (MΩ) or greater.

19. The display apparatus of claim 17, wherein some of the plurality of bent portions are arranged to face each other with respect to the center axis.

20. The display apparatus of claim 17, wherein the second conductive layer has an island shape.

* * * * *